United States Patent [19]
Diamand

[11] Patent Number: 4,879,581
[45] Date of Patent: Nov. 7, 1989

[54] TRANSFERRED ELECTRON DEVICE WITH PERIODIC BALLISTIC REGIONS

[75] Inventor: Félix Diamand, Paris, France
[73] Assignee: Thomson-CSF, Paris, France
[21] Appl. No.: 71,361
[22] Filed: Jul. 9, 1987

[30] Foreign Application Priority Data

Jul. 9, 1986 [FR] France ................... 86 09976

[51] Int. Cl.$^4$ .................. H01L 27/26; H01L 27/12; H01L 47/02
[52] U.S. Cl. .................................. 357/3; 357/4
[58] Field of Search ............................. 357/3, 4

[56] References Cited

U.S. PATENT DOCUMENTS

| | | | |
|---|---|---|---|
| 3,479,611 | 11/1969 | Sandbank et al. | 357/3 |
| 3,581,232 | 5/1971 | Murayama et al. | 357/3 |
| 3,667,003 | 5/1972 | Hilsum et al. | 357/3 |
| 4,238,763 | 12/1980 | Gray et al. | 357/3 |
| 4,320,313 | 3/1982 | Gloanec et al. | 357/3 |
| 4,410,902 | 10/1983 | Malik | 357/4 |
| 4,539,581 | 9/1985 | Malik et al. | 357/58 |
| 4,649,405 | 3/1987 | Eastman | 357/3 |

OTHER PUBLICATIONS

Streetman, "Solid State Electronic Devices" ©1980 by Prentice-Hall, Inc., pp. 424-429.
International Electron Devices Meeting—IEDM Technical Digest Washington, D.C., 8-10 Dec. 1980, pp. 456-459, Electron Devices Society of IEEE; R. J. Malik et al: "GaAs planar doped barriers by molecular beam epitaxy *p. 458, paragraph Applications"*.
IEEE Electron Device Letters, vol. EDL-3, No. 12, december 1982, pp. 407-408, IEEE, New York, U.S.; J. A. Cooper, Jr. et al: "Semiconductor structures for repeated velocity overshoots" *p. 408, col. 1, lines 32-41*.

Primary Examiner—Eugene R. LaRoche
Assistant Examiner—Michael B. Shingleton
Attorney, Agent, or Firm—Oblon, Spivak, McClelland, Maier & Neustadt

[57] ABSTRACT

The invention provides a new transferred electron device, including a substrate, a metal layer forming the cathode contact, an N doped semiconductor input layer and a periodic structure formed of elementary cells; each cell includes a short ballistic doped region defined on each side by a very thin layer, respectively P+ and N+, and followed by a transit region of an homogeneous N doped material. In the short ballistic regions, the electrons acquire the energy necessary for the transfer from the band $\Gamma$ to the band L in a time less than the collision time, then the transit regions allow the thermalization of the electrons which arrive at the following ballistic region with a mean energy still equal. A metal contact anode is provided on this last transit region.

3 Claims, 4 Drawing Sheets

FIG_1 (PRIOR ART)
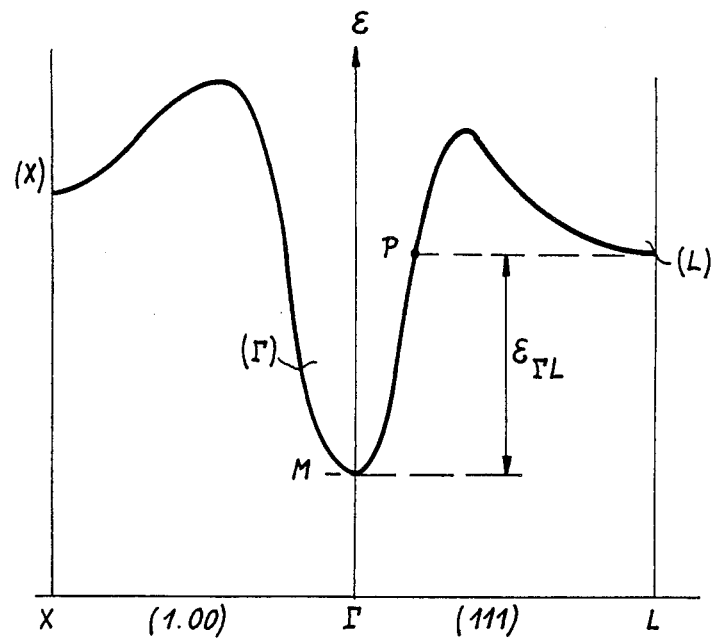
FIG_2 (PRIOR ART)
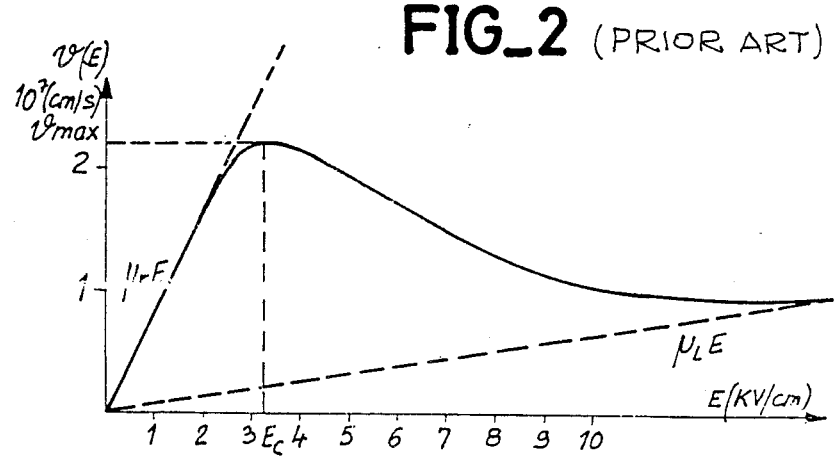

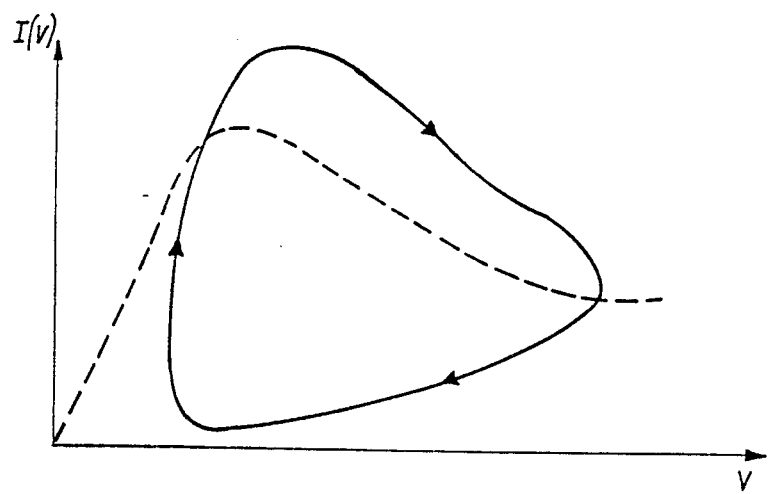
FIG_3 (PRIOR ART)
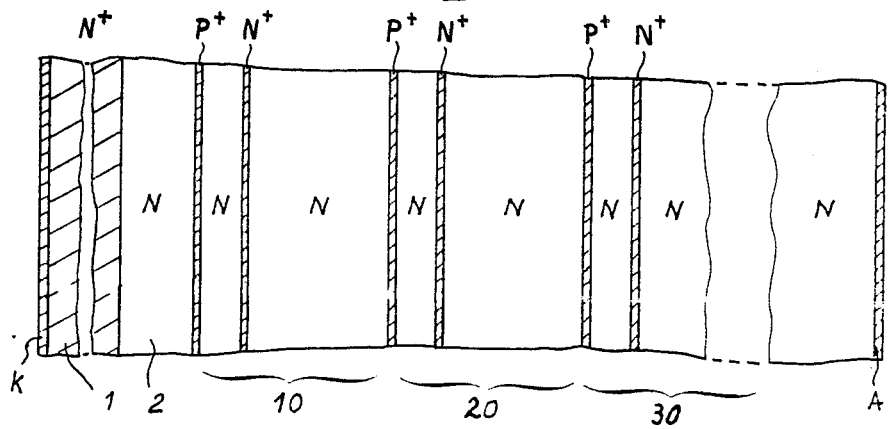
FIG_4

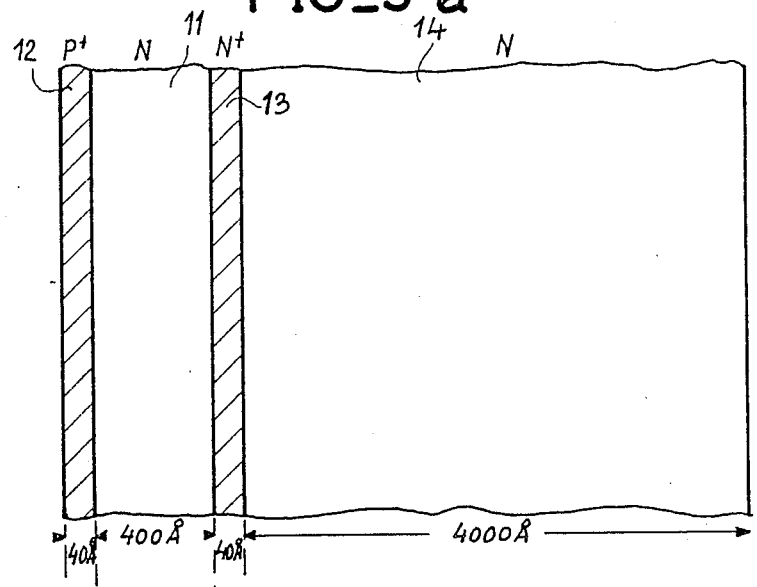
FIG_5-a
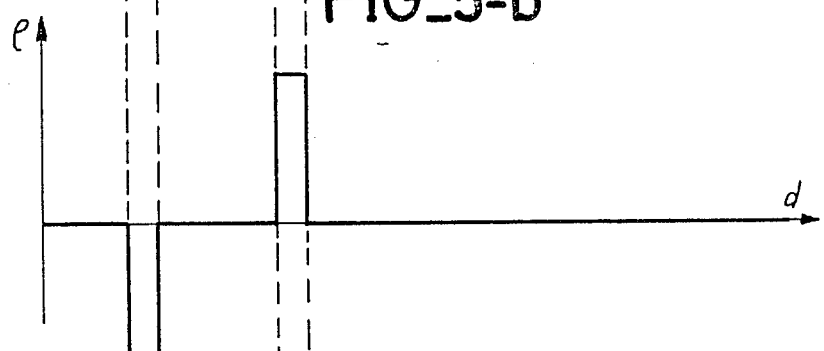
FIG_5-b
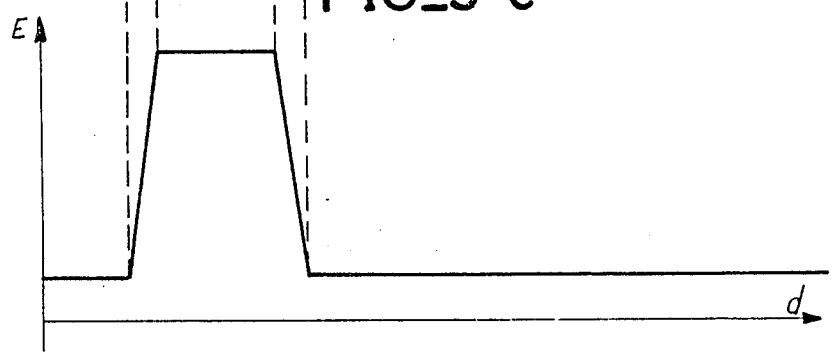
FIG_5-c

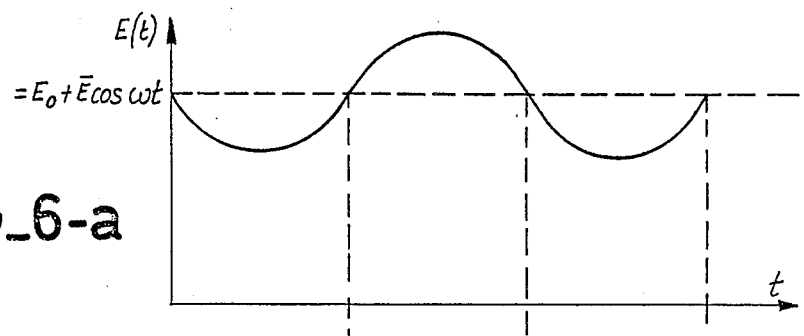
FIG_6-a
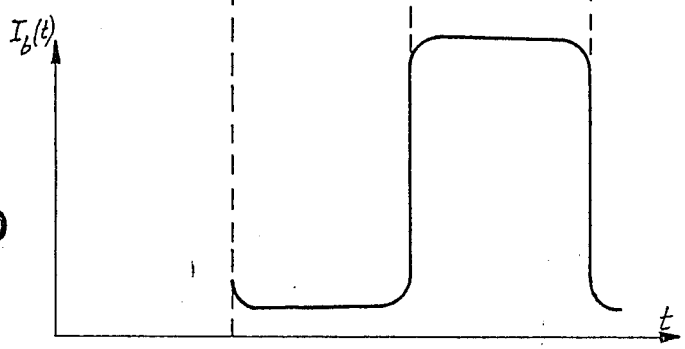
FIG_6-b

TRANSFERRED ELECTRON DEVICE WITH PERIODIC BALLISTIC REGIONS

BACKGROUND OF THE INVENTION

The invention relates to the field of semiconductors and more particularly to a transferred electron device (TED).

Transferred electron device, or Gunn effect diodes, are widely used in ultrahigh frequency equipment. Their low oscillator noise, their robustness, their compactness, their modest cost and their reduced bias voltage designate them quite particularly as local oscillator or an emission source in radars, Doppler radars and certain short wave links. For ten years or so, the performances have been increased up to the band of millimetric waves. Indium phosphide InP diodes have given, in continuous operation, up to 250 mW at 56 GHZ, 125 mW at 94 GHz with respective efficiencies of 8% and 4%.

The invention aims at improving the performances of millimetric Gunn effect diodes. For that, a new transferred electron device is proposed, for the millimetric band, whose purpose is to overcome the defects of Gunn diodes which limit their performances: dead zone, relaxation phenomena and resistance of the contacts particularly.

SUMMARY OF THE INVENTION

A transferred electron device, TED, of the invention includes an N+ doped semiconductor substrate one face of which is provided with a metal contact forming the cathode and the other face of which is coated with an N doped semiconductor input layer followed by an active semiconductor structure having a metal contact forming the anode, the semiconductor structure including at least one elementary cell having a short N doped ballistic region between two very thin semiconductor layers, heavily doped respectively P+ and N+, and a longer N doped transit region, the ballistic region allowing the electrons to be brought up to a high energy level in a time less than the collision time, and the transit region allowing the electronic energy to be brought back, by relaxation with the network, to a value very much lower than the transfer energy.

BRIEF DESCRIPTION OF THE DRAWINGS

The invention will be better understood and other characteristics will be clear from the following description, with reference to the accompanying Figures in which:

FIG. 1 shows the diagram of energy $\epsilon$ of the conduction band;

FIG. 2 shows the electronic drift velocity as a function of the electric field for gallium arsenide, FIG. 3 shows with a broken line the current-voltage characteristic of the diode under idealized conditions and with a continuous line a dynamic characteristic in the accumulation mode;

FIG. 4 is a diagram of the electron transfer diode of the invention;

FIGS. 5a, 5b and 5c show respectively an elementary cell of the diode of the invention and the associated charge and electric field profiles;

FIGS. 6a and 6b show respectively the voltage and the current as a function of time in the ballistic region.

DESCRIPTION OF THE PREFERRED EMBODIMENT

The millimetric Gunn effect is a negative resistance bulk effect which can be observed in certain III-V compounds, for example gallium arsenide GaAs or indium phosphide, InP. It originates in the transfer of electrons of the conduction band, under the effect of the electric field, from a valley with high mobility to upper valleys with low mobility. The diagram of the energy levels $\epsilon$ as a function of the wave vectors $\vec{k}$, $\epsilon(\vec{k})$ of the conduction band is shown in FIG. 1. It is formed of several sub-bands. The sub-band with lowest energy, in the case of gallium arsenide GaAs and indium phosphide InP which will be considered here, is the valley ($\Gamma$) centered at K=O. Rising in the energy scale, the next sub-band (L) is formed of four equivalent valleys, along the four equivalent axes (111). As is known, the difference between the valleys ($\Gamma$) and (L) is the transfer energy $\epsilon_{\Gamma L}$, equal to 0.33 eV for GaAs and 0.54 eV for InP. The next sub-band X has little influence and will be neglected. The effective mass of the electrons in the subband (L) is appreciably greater than that of the electrons in the sub-band ($\Gamma$). It is therefore the same for the densities of the levels, whereas the mobility is appreciably lower in the sub-band (L), $\mu_L$ than in the sub-band ($\sigma$), $\mu_{64}$.

FIG. 2 shows, for gallium arsenide GaAs, the characteristic v(E), the stationary drift velocity of electrons in a constant field E. For increasing values of E, from E=0, we can observe first of all the ohmic characteristic $v=\mu_\Gamma E$ all the electrons are in the main valley, their mean energy is substantially equal to 3 KT where T is the temperature of the network, and K Boltzmann's constant. With E a little larger, the electron receives, between two collisions, more energy than it can yield up during a collision and the mean energy becomes greater than 3/2 KT: a tendency to saturation appears, related on the one hand to a reduction of $H_\Gamma$, and on the other hand to a beginning of transfer from the band ($\Gamma$) to the band (L). However, for E=2500 V/cm, the population of the valley (L) still represents less than 2%. For E greater than 2500 V/cm, the mean value of the electronic energy increases more strongly with E, the transfer from band ($\Gamma$) to band (L) is accentuated, whence a lowering of the mean mobility $\mu:\mu=(n_\Gamma\mu_\Gamma+n_L/\mu_L)./n$, where $n_\Gamma$ and $n_\Gamma$ are respectively the numbers of electrons in the sub-bands ($\Gamma$) in the sub-band (L) and n the total number. The drift velocity passes through a maximum $v_{max}$ for the critical field $E_c$ substantially equal to 3200 V/cm. For an electric field E greater than the critical field $E_c$, $n_L$ increases to the point that v(E) has a negative slope. Finally, for an electric field E very much greater than the critical field $E_c$, the majority of the electrons are in the valleys (L) so that the curve v(E) tends towards the straight line $v=\mu_L E$. For indium phosphide InP, the critical field $E_c$ is higher, 10 kV/cm, as well as the maximum speed $v_{max}$, which is explained by the greater value of the transfer energy (0.54 eV) and a shorter relaxation time of the energy.

There exists no simple model for an electron transfer oscillator, but the following explanation approximates the operation under idealized conditions.

Several operation modes are possible depending on the values of the physical parameters of the diode and of the circuit. With an homogeneous GaAs layer, of type N, having two contacts, the cathode contact being assumed to be neither injecting nor limiting, the admission of current into the diode preserves the charge neutrality and so maintains the electric field at the same value throughout the whole volume of the layer. These ideal conditions may be approximated in a narrow current range, by means of a Schottky contact with weak barrier. If we assume in addition that these conditions are provided at all times during the HF cycle, then the current characteristic as function of the voltage, I(V), of the diode is derived from the curve v(E) simply by affinity, I(V)=qNv(V/d), where d is the thickness of the layer and N the doping, that is to say the density of the fixed and mobile charges. FIG. 3 shows this characteristic with a broken line. By choosing the biasing point towards the middle of the negative slope region, the diode behaves like a negative resistance for an HF signal, the reactance being negligible.

This model neglects the influence of the contacts, the space charge instabilities, the transit time effects, the displacement current and the relaxation mechanisms which form major limitations to very high frequencies:

the cathode contact creates a charge inhomogeneity in its neighbourhood which forms the center of a space charge instability if the field is greater than the critical field. The type of instability depends on the nature of the contact. An ohmic contact N+—N is an injecting contact which creates an excess of electrons at the input to the active zone, which promotes the formation of an accumulation domain. A reverse biased Schottky contact with weak barrier is on the contrary a limiting contact which causes the formation of a dipolar domain. The growth rates of these two types of instability are different, the most rapid being that of an accumulation domain. The growth of a dipole domain is slowed down because of the charge depletion relates to the limiting contact. In the case of a millimetric diode, for a transit time of the order of $10^{-11}$s, for $N=5.10^{15}$ carriers per cm$^3$, development of the dipolar domain is incomplete. An operation of this type, without appreciable charge bunching, is compatible with good performances: the best known powers and efficiencies at 94 GHz have been obtained with limiting contacts on indium phosphide, InP, diodes as described by Y. D. CROWLEY and F. B. FANK in an article entitled "Millimeter Wave InP Gunn Devices", 4.INST Measur. T. E. 1984, vol. 18, p. 11.

The relaxation mechanisms which limit the performances of millimetric diodes are of two kinds. Firstly, there is the force of inertia which means that the electron responds with a delay to a spatial or time variation of the electric field. This delay is characterized by the acceleration-deceleration time $\tau_{ad}$. Secondly, there is energy relaxation in the main valley $\Gamma$, characterized by a time constant $\tau_\epsilon$. The intravalley (L) or intervalley $(\Gamma)<->(L)$ and $(L)<->(L)$ relaxations are faster. The result is that the electrons of the valleys (L) are thermalized with the network in a short time with respect to $T_E$. The distribution of the electron populations between the valleys ($\Gamma$) and, (L) is also established almost instantaneously with respect to $\tau_\epsilon$. The energy relaxation of the whole of the electrons is therefore subordinated to that of the main valley, which leads for high energies, to an effective relaxation time longer than $\tau_\epsilon$. In fact, for a mean energy of the order of the transfer energy, $n_L/n_\Gamma$ is of the order of $d_L/d_\Gamma$, where $d_L$ and $d_\Gamma$ are the densities (of states) of the levels (L) and ($\Gamma$), whence an effective relaxation time described by B. K. RIDLEY in "Anatomy of the transferred electron effect in III.V semmiconductors", The Journal of Applied Physics, Vol. 48, No. 2, pp. 754–764, 1977:

$$(\tau_\epsilon)_{eff}=\tau_\epsilon d_\Gamma+d_L/d_\Gamma \text{ near } 3\tau_\epsilon$$

The values given are $(\tau_\epsilon)_{eff}=3$ ps for GaAs, 1.5 ps for InP, that is to say respective cut off frequencies of 50 GHz and 100 GHz. For a mean energy situated between the energy range $\epsilon_\Gamma$ and the energy of the optical photon $\epsilon_{ph}$, so that the number of electrons in the valleys L is very much less than the number of electrons in the valley $\Gamma$ and so that the absorption of optical photons is negligible with respect to the emission, $\tau_\epsilon$ is of the order of $\tau_{ph}(\epsilon-\epsilon_\Gamma)/\epsilon_{ph}$, where $\tau_{ph}=0.13$ ps is the electron-optical phonon scattering time, $\epsilon_{ph}=0.035$ eV for GaAs.

The continuous line curve shown in FIG. 3 represents the dynamic current-voltage characteristic of a millimetric diode oscillating in accumulation mode as described by H. D. Rees in "Hot Electron Devices for millimeter and submillimeter applications", Proc. of Hot carriers Conference, Montpellier, July 7-10, 1981. It shows the effect of these time constants which result in an appreciable current-voltage phase shift, whence a lowering of the performances of the diode for ultrahigh frequencies. During the half cycle where V(t) decreases, the current is maintained at a low value with respect to the current of the bulk characteristic. This discrepancy is related to rethermalization delay: the electrons trail in the low mobility valley (L) when the field decreases. This effect also shows that the only possible millimetric modes are transmit modes: the only means of obtaining rethermalized electrons is to remove them by means of the anode.

A "dead zone" is formed in front of the cathode, related to the nature of the contact and to the relaxation mechanisms. An electron released by the cathode must cover a certain distance in the direction of the field so as to acquire the transfer energy $\epsilon_{\Gamma L}$. This space where the electron absorbs energy, is equivalent to a loss resistance which degrades the HF power and the efficiency. The effect of the dead zone is all the more harmful the greater its length d with respect to that of the active region l. d depends on the nature of the material and on the contact. Furthermore, l is proportional to 1/f for a transmit mode. The effect of the dead zone therefore increases when the frequency increases. The good results obtained with limiting contacts are related, probably for a large part, to their shorter dead zone, the field being maximum at the cathode and relatively uniform, whereas for an ohmic contact, the field is zero at the cathode. The better performances of InP, with respect to GaAs, can also be explained, to a certain extent, by a shorter dead zone. An order of size of d is obtained by assuming a ballistic path in a constant field $E=E_c$. Whence $$d=\epsilon_{\Gamma L}/q\cdot E_c$$

namely $d=1$ $\mu$m for GaAs and $d=0.5$ $\mu$mm for InP.

The diagram of the diode of the invention for overcoming the above mentioned drawbacks is shown in FIG. 4. This diode is formed by a periodic structure including an N+ doped substrate 1, of thickness between 20 and 100 micron for example comprising possibly an N+ epitaxied buffer layer with, on the other face, a metal layer forming the cathode K of the diode. The substrate is coated with an N doped input layer 2 having a thickness of the order of 1000 Å for example, then a succession of elementary cells 10, 20, 30 ... The last cell is coated with a metal conducting layer forming the anode contact A. FIG. 5a shows an elementary cell. Each elementary cell includes a short N doped "ballistic" region 11 of a few hundreds of Angstroms, defined by two very thin (20 to 50 Å) heavily doped P+ and N+ layers respectively 12 and 13 and followed by a longer (0.3 to 0.5 μm) transit region of an homogeneous N material 14. The P+ and N+ layers are completely depleted whence the charge and field E profiles shown in FIGS. 5b, 5c. The short region 12 is a ballistic region where the electron acquires a high energy in a time t less than the relaxation time of the amount of movement $\tau_m$. It should be mentioned that a structure including such short ballistic region has been described by I. A. COOPER, Jr. et al. in an article entitled "Semiconductor Structures for Repeated Velocity Overshoot", IEEE Electron Device Letters vol. EDL-3, No. 12, December, 1982, with the purpose of producing an electronic overshoot: the electrons are subjected successively to ballistic acceleration followed by rethermalization, which theoretically gives in gallium arsenide GaAs a mean velocity of the order of four times the saturation velocity. The short ballistic region is used in the structure of the invention for creating a negative resistance during the whole of the HF cycle time: with slightly different physical characteristics and biasing conditions which will be explained hereafter.

Before describing the operation of this new diode, these physical parameters and the main conditions which this structure must satisfy should be stated:

(1) the short region 11 must be ballistic for an electric field $E_o$ such that the electron is accelerated to the transfer energy $\epsilon_{\Gamma L}$ after passing through this region, namely $\epsilon_{\Gamma L} = qE_o d$, where d is the length of the ballistic region 1, and $t_b$ less than $\tau_{ph}$ and $t_b$ is the ballistic transit time and $\tau_{ph}$ is the electron-phonon collision time (0.13 ps for GaAs as mentioned above). $t_b$ is given, while neglecting the band parabolicity departure, by $t_b = (2m^*)^{\frac{1}{2}}/\epsilon_{\Gamma L} \cdot d$, where m* is the effective mass of the electrons (2) the charge of the desert regions, the P+ doped region 12 and the N+ doped region 13, must be adjusted so that by biasing the ballistic region to the field $E_o$, the field $E_1$ in the transit region 14 is close to and slightly less than the critical field $E_c$.

(3) the transit region 14 must be long enough so that an electron which enters this region with the energy $\epsilon_{\Gamma L}$ (it may be an electron in the valley (Γ) or (L)) is thermalized during its travel, so that it reaches the next ballistic region with a mean energy independent of the position of this ballistic region in the complete structure; thus the boundary conditions from one cell to another are similar.

The operation of such a structure is then the following: when a cell of the structure is subjected to a voltage of the form $V_o + \overline{V} \cos \omega t$, the result is, in the ballistic region while neglecting the effect of the electronic space charge, a field E(t) of the form $E_o + \overline{E} \cos \omega t$, where $E_o$ is defined by the condition $E_o = \epsilon_{\Gamma L}/F_{\Gamma L/qd}$.

This field is shown in FIG. 6a. The current emitted by the ballistic region $I_b(t)$ is the trend shown in FIG. 6b. In fact, during the positive half wave, the electrons acquire an energy greater than $\epsilon_{\Gamma L}$: under the effect of the field, the energy of the electrons in the sub-band (Γ) increases, following the energy characteristic of FIG. 1, from point M to point P. As soon as this point P is reached the electrons pass into the sub-band (L) because of the high statistic weight of this sub-band. The majority of the electrons are therefore transferred into the valley (L) where they are thermalized practically instantaneously with the network. They enter into the transit region with the mobility $\mu_L$, very much less than $H_\Gamma$. If we assume that $H_\Gamma = 0.6$ m²/Vs and that $\mu_L = H_\Gamma/15 = 0.04$ m²/Vs, and with a critical field of the order of $E_c = 3.2 \times 10^5$ V/m, the velocity of the electrons at the input of the transit region during the positive half cycle is v' substantially equal to $\mu_L E_c$, namely 1.3 10⁴ m/s. During the negative half cycle, the electrons do not reach the threshold energy, for the majority of them. They remain in the high mobility valley (Γ). They then enter the transit region with a velocity $$v'' = [2\epsilon^*/m]^{\frac{1}{2}}$$

where $\epsilon^*$ is less than but not very different from the threshold energy, therefore $v'' = 1.35 \cdot 10^6$ m/s, v'' is close to 100 times v'. In fact, for energy of this order, the non-parabolicity of the valley (Γ) is not negligible, whence a value of v'' a little lower of the order of $10^6$ m/s.

The ballistic region therefore delivers an electronic current $I_b(t)$ in phase opposition with the voltage, with a very high modulation index. Because of the high field in this region ($E_o$ is ten to twenty times greater than the critical field $E_c$), the dead zone is practically suppressed and the acceleration time up to the threshold energy, $\tau_a(E_o)$, is negligible since $\tau_a(E_o) = t_b$ and less than $\tau_{ph} = 0.13$ ps in the case of GaAs, which is very much less than the corresponding time for the conventional Gunn diode. For this diode in fact, the acceleration time to the critical energy, $\tau_a(E_c)$, is about 10 to 20 times greater than $\tau_a(E_o)$. The time actually required for acquisition of the threshold energy is even greater because $\tau_a(E_c)$ is large as compared to $\tau_{ph}$ which means that the threshold energy cannot be reached, for $E = E_c$, by a simple ballistic acceleration, but rather by increasing the disordered energy (possibly approximated by an "electronic temperature") because of the important role played by the collisions under these conditions. The new structure therefore appreciably improves the frequency limitations.

The purpose of the transit region is to permit momentum and energy relaxation, which entails conditions concerning the field $E_{tr}$ in this region and concerning the length of this region:

the field $E_{tr}$ must be less than the critical field at all times so that the transit region does not appreciably contribute to populating the valley (L). $E_{tr}$ very close to the critical field would be acceptable. In fact, at the time when the positive half cycle starts, a depleted zone is formed at the input of the transit region since at that time high speed electrons precede slow electrons, which leads to a charge depletion; whence a field profile similar to that of a limiting contact, namely a field which decreases in the transit region from the input towards the output. Towards the beginning of the negative half wave, on the contrary an accumulation zone is formed, whence a field profile slanting in the opposite direction.

the length of the transit region 14 must be sufficient and just sufficient for an electron to be able to relax its momentum and its energy during its crossing. What happens during each half cycle should be examined separately because the transit times as well as the relaxation times are different. During the negative half cycle, in the case of GaAs, for $\tau_m=0.25$ ps and $\tau_\epsilon=1$ ps, the minimum length of the transit region compatible with a complete rethermalization is 4000 Å and, for this length, the mean velocity is $4.10^5$ m/s. During the positive half cycle, the relaxation involves the two valleys (Γ) and (L). Following the remarks made above, the time for relaxation of the energy is then of the order of $\tau_{\epsilon eff}=3$ ps. During this time, the electron speed passes progressively from $\mu_L E_c$ of the order of $10^6$ cm/sec to $\mu_\Gamma E_c$ of the order of $10^7$ cm/sec. The distance travelled by an electron during the time $\tau_{\epsilon eff}=3$ ps is then of the order of 1500 Å. In conclusion, the greatest of the two distances will have to be taken for the length of the transit region, namely 4000 Å.

To explain the choice of the physical parameters and the embodiment, the case of GaAs is given by way of non limitative example. Transposition to InP can be deduced therefrom.

The parameters of the ballistic region are defined by the above mentioned relationships:

$$\epsilon_{\Gamma L}=qxE_0xd \text{ and } t_b=[2m^*/\epsilon_{\Gamma L}]^{\frac{1}{2}xd}$$

namely: $t_b=1.47\times 10^{-6}xd$ $t_b-1.47.10^{-6}\cdot d$. The ballistic operating condition, $t_b$ less than $\tau_{ph}$, then gives: d less than $8.8.10^{-8}$ m. The modulation index of the current is an increasing function of $E^{-1}_o$, that is to say of d. Therefore a high value is chosen for d reasonably compatible with the ballistic condition, namely $d=5\times 10^{-8}$ m, whence the field can be deduced: $E_o=\epsilon_{\Gamma L}/qd=6.6\times 10^6$ V/m. The charge of the P+ and N+ regions is given by assuming $P+=N+=N_c$ and of equal thicknesses, δ, small with respect to d by: $N_c\delta=(E_o-E_c)\epsilon_o\epsilon_r/q=4.34\times 10^{15}$ m$^{-2}$, that is to say $N_c$ greater than $0.87\times 10^{23}$ m$^{-3}$. By taking $N_c=10^{24}$ m$^{-3}$, this condition is largely satisfied and the thickness is then of the order of 50 Å.

The length l of the transit region was determined above, l is of the order of 4000 Å. Doping should be of the order of $5\times 10^{21}$ m$^{-3}$ to $10^{22}$ m$^{-3}$ for a frequency of the order of 90 GHz. This doping is weaker than that for a Gunn diode with an N+—N contact, at the same frequency, for in this latter case the formation of the accumulation domain must be sufficiently rapid and the growth rate of the domain is proportional to the doping. The advantages of weaker doping (this is the case of limiting contact diodes) are a better heat dissipation, and a higher negative impedance which leads to lower HF losses.

For minimizing the losses, the circuit losses must be reduced by using a high load resistance and the losses related to the diode itself must be reduced, that is to say both the losses related to the metallization-substrate contacts are those due to the dead zone effect in the input layer of the diode.

To obtain this result, in the preferred embodiment described with reference to FIG. 4, several elementary cells are placed in series. Thus, the dead zone and loss effect in the substrate affect a higher negative resistance, which reduces their effect proportionally.

The limitation in the number of elementary cells able to be placed in series is related on the one hand to the reproducibility during manufacture (accuracy in doping and dimensioning) and on the other hand to the thermal resistance of the assembly which of course must not be too high.

The number of elementary cells is such that it forms a satisfactory compromise between the thermal resistance and the negative impedance. This leads then to a structure which, in the best embodiment includes 3, even 4 cells.

But a diode which only has one elementary cell could be sufficient for certain uses.

For manufacturing the diodes of the invention, the most appropriate growth method for the semiconductor layers is molecular jet epitaxy for GaAs, and organometallic gas epitaxy for InP. These known methods are obviously not limiting.

What is claimed is:

1. A transferred electron device including an N+ doped semiconductor substrate having one face provided with a metal contact forming a cathode and an other face coated with an N doped semiconductor inut layer followed by an active semiconductor structure with a metal contact forming an anode, wherein said semiconductor structure is a periodic structure including a succession of elementary cells, each cell having a short N doped ballistic region between two very thin semiconductor layers, strongly doped respectively P+ and N+, and a longer N doped transit region, said ballistic region allowing the electrons to be brought to a high energy level in a time less than the collision time, and the transit region allowing the electron energy to be brought down by relaxation to a value very much less than the transfer energy.

2. The device as claimed in claim 1, wherein: with gallium arsenide used as the semiconductor material for forming the diode, said ballistic region of each elementary cell has a thickness of the order of 400 Å, the respectively doped P+ and N+ limitation layers having a thickness of the order of 40 Å, whereas said transit region has a thickness of the order of 4000 Å.

3. The device as claimed in claim 1, wherein the semiconductor material used for forming said diode is indium phosphide.

* * * * *